United States Patent [19]
Hilbrink

[11] Patent Number: 5,427,984
[45] Date of Patent: Jun. 27, 1995

[54] METHOD OF MAKING A COOLING PACKAGE FOR A SEMICONDUCTOR CHIP

[75] Inventor: Johan O. Hilbrink, Cincinnati, Ohio

[73] Assignee: AT&T Global Information Solutions, Dayton, Ohio

[21] Appl. No.: 24,129

[22] Filed: Mar. 1, 1993

[51] Int. Cl.⁶ .......................................... H01L 21/60
[52] U.S. Cl. ................................... 437/214; 437/214; 437/220; 437/902
[58] Field of Search ............... 437/214, 220, 248, 209, 437/215, 217, 902

[56] References Cited

U.S. PATENT DOCUMENTS

| | | |
|---|---|---|
| 3,793,714 | 2/1974 | Bylander . |
| 4,132,856 | 1/1979 | Hutchison et al. . |
| 4,703,339 | 10/1987 | Matsuo . |
| 4,748,495 | 5/1988 | Kucharek ............................ 361/382 |
| 4,803,546 | 2/1989 | Sugimoto et al. . |
| 4,822,550 | 4/1989 | Komathu ............................ 437/211 |
| 4,826,440 | 5/1989 | Plocek et al. ....................... 206/328 |
| 5,019,940 | 5/1991 | Clemens . |
| 5,055,914 | 10/1991 | Shimizu et al. . |
| 5,081,067 | 1/1992 | Shimizu et al. . |
| 5,091,341 | 2/1992 | Asada et al. . |
| 5,138,521 | 8/1992 | Watanabe et al. . |
| 5,139,973 | 8/1992 | Nagy et al. . |
| 5,293,067 | 3/1994 | Thompson et al. .................. 257/668 |

*Primary Examiner*—Olik Chaudhuri
*Assistant Examiner*—Long Pham
*Attorney, Agent, or Firm*—Albert L. Sessler, Jr.

[57] ABSTRACT

A cooling package for a semiconductor chip includes, in addition to the chip, leads for the chip provided by a tape automated bonding frame, a cold header attached to the chip, a header frame, a pitch translator printed circuit board having conductive pads for receiving the chip leads and a plurality of holes connected to the pads, a plurality of attachment devices such as hollow thin wall stainless steel pins positioned in the holes, and a cavity insulator. The method of chip package assembly requires the assembly of two sub-assemblies and the subsequent assembly of the two sub-assemblies into a chip package.

16 Claims, 6 Drawing Sheets

METHOD OF MAKING A COOLING PACKAGE FOR A SEMICONDUCTOR CHIP

BACKGROUND OF THE INVENTION

The present invention relates generally to a semiconductor chip package and method of making it, and more particularly relates to such a package and method for use when the chip is to be cooled for optimizing circuit performance.

The current method of assembling a semiconductor chip into a package and assembling the package onto a printed circuit board is disadvantageous when the semiconductor is to be cooled to low operating temperatures. Since cooling of semiconductor chips has become more important as a means for increasing performance of such chips, improvement of assembly methods has also become more important. The disadvantage of the current method is that the package material is a good thermal insulator, while the electrically conductive materials which provide an electrical path from the printed circuit board into the integrated circuit socket pin, to the chip package pin, through the conductor in the chip package, and through the wire bond, is thermally conductive as well as electrically conductive. If the chip is to be cooled to below-freezing temperatures, the thermal insulation of the chip package makes such cooling difficult, while at the same time the thermally conductive path through the electrical leads conducts heat to the chip, making cooling of the chip more difficult. Furthermore, the thermally conductive path may cool the socket pins or the printed circuit board trace to a temperature below the freezing point, where frost or condensation can accumulate in the electronic circuit.

SUMMARY OF THE INVENTION

An improved chip package and an improved method of chip package assembly enhance the thermal path from the chip to the cooling source, and by the choice and form of material reduce the thermal conductivity of the electrical path.

The chip package, in addition to the chip, includes leads which may be provided by a tape automated bonding (TAB) frame, a cold header attached to the chip, a header frame, a pitch translator printed circuit board with a plurality of pads and holes associated with the chip leads, a plurality of hollow pins positioned in the holes and a cavity insulator.

The method of chip package assembly requires the assembly of two sub-assemblies and the subsequent assembly of the two sub-assemblies into a chip package.

It is accordingly an object of the present invention to provide an improved method of making a cooling package for a semiconductor chip.

Additional benefits and advantages of the present invention will become apparent to those skilled in the art to which this invention relates from the subsequent description of the preferred embodiment and the appended claims, taken in conjunction with the accompanying drawings.

BRIEF DESCRIPTION OF THE DRAWINGS

FIG. 9 is a perspective view of a pitch translator printed circuit board used to translate the peripheral pitch of the TAB leads to an array pitch of small holes capable of accepting thin walled hollow pins. FIG. 9 also includes an enlarged showing of a corner of the printed circuit board and lead pads, conductors and holes.

DETAILED DESCRIPTION

Figure 1:
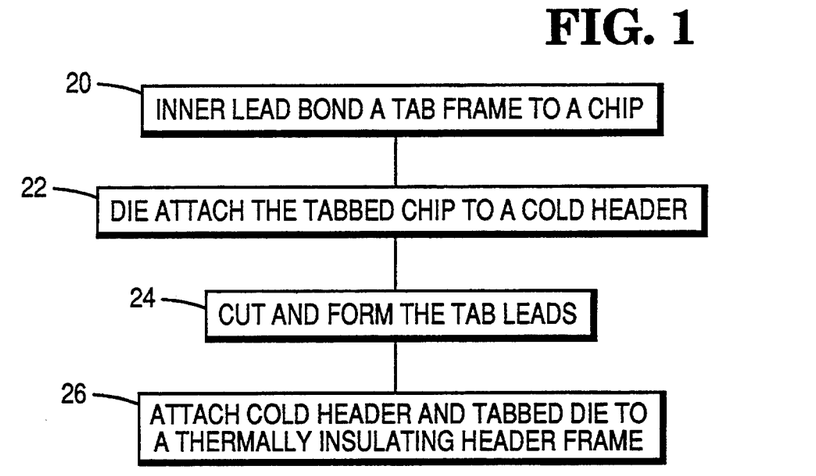
FIG. 1 is a flow diagram showing a process for assembling a first sub-assembly.
Figure 2:
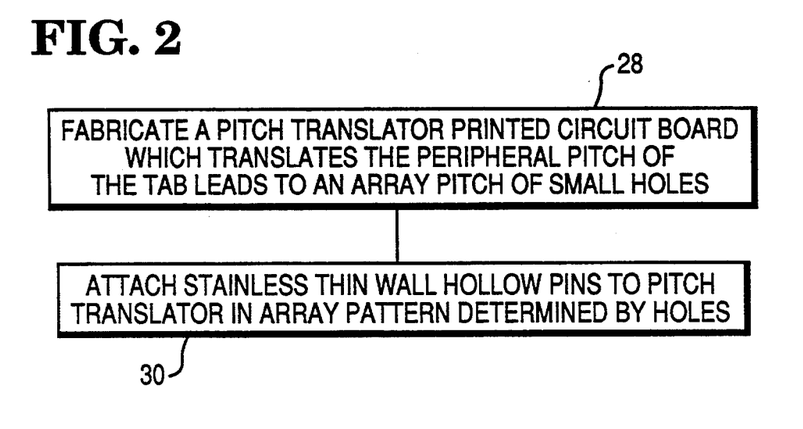
FIG. 2 is a flow diagram showing a process for assembling a second sub-assembly.
Figure 3:
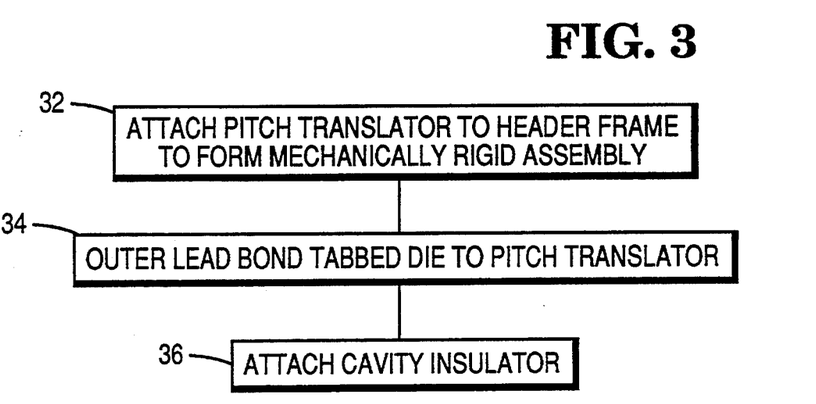
FIG. 3 is a flow diagram showing a process for final assembly of the first and second sub-assemblies.

Referring now to the drawings, FIGS. 1, 2 and 3 are flow diagrams setting forth the process steps for fabricating first and second sub-assemblies of the cooling package, and then assembling these two sub-assemblies to provide the complete package. FIGS. 4 to 13 inclusive show components of the package at various stages of the assembly.

Figure 4:
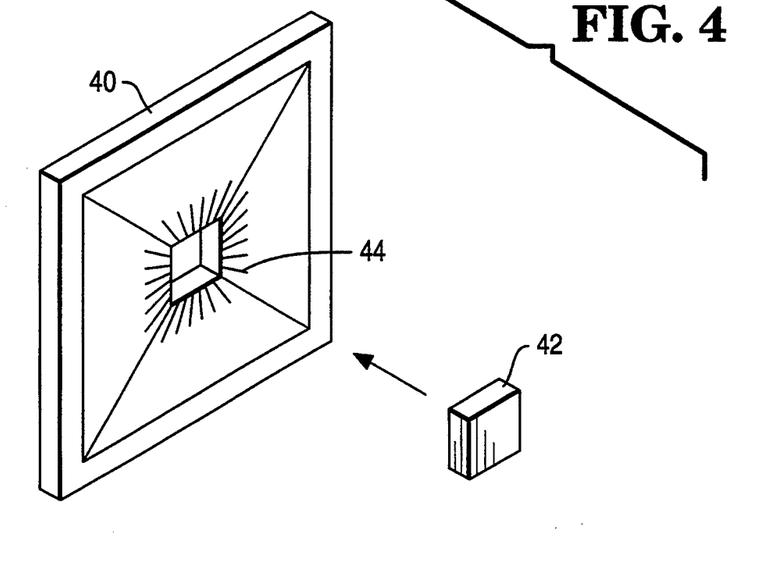
FIG. 4 is an exploded perspective view showing the assembly of a semiconductor chip and a tape automated bonding (TAB) frame.
Figure 5:
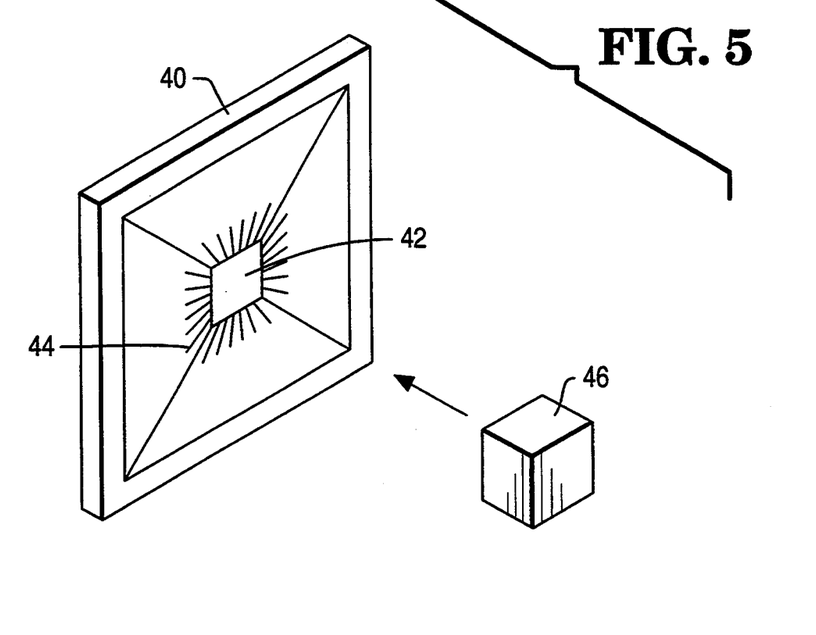
FIG. 5 is an exploded perspective view showing the assembly of a cold header to the chip to which leads have been applied.
Figure 6:
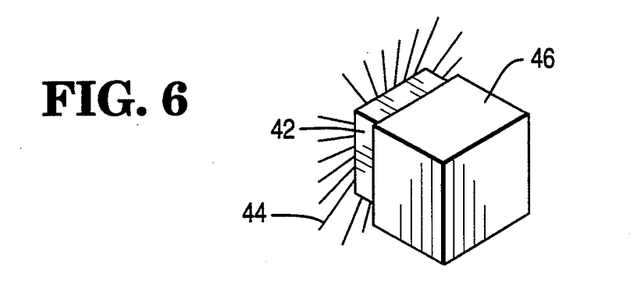
FIG. 6 is a perspective view showing the assembled cold header and semiconductor chip with TAB leads having been cut from the TAB frame and formed.
Figure 7:
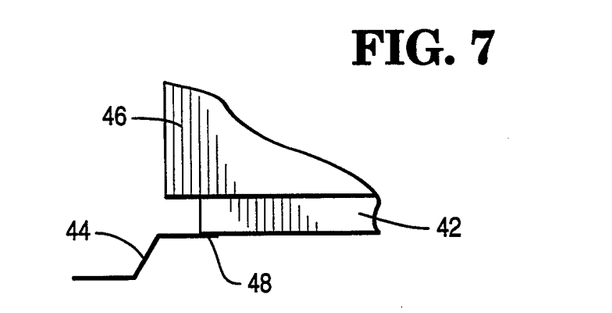
FIG. 7 is a fragmentary elevation view of the structure of FIG. 6, showing the cold header, the chip and the formed TAB leads.
Figure 8:
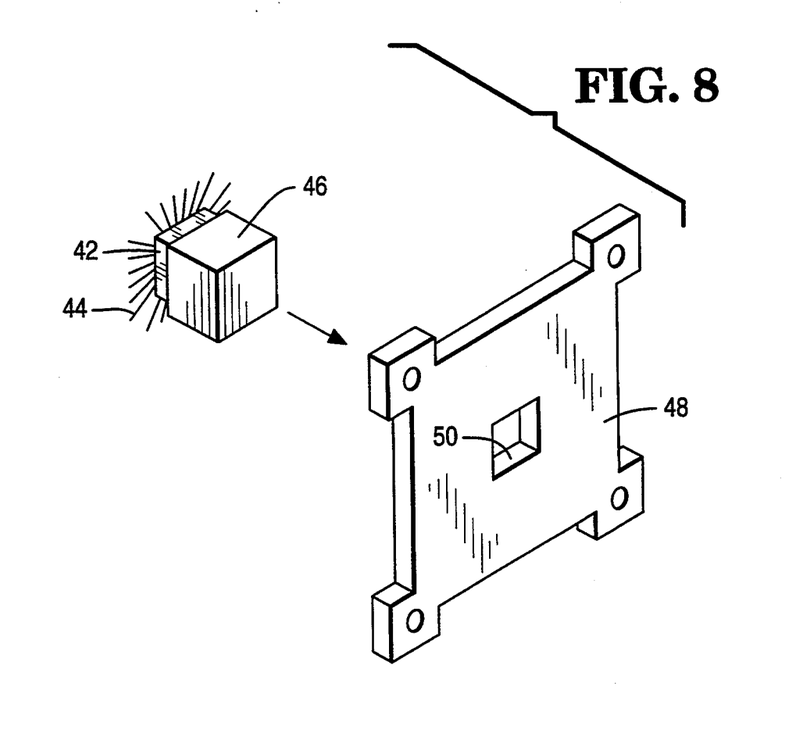
FIG. 8 is an exploded perspective view showing the assembly of a header frame to the chip and cold header structure.

As shown in FIGS. 1 and 4, in the first step of the process, represented by block 20, a tape automated bonding (TAB) frame 40 is inner lead bonded (ILB) to a semiconductor chip 42, so that the individual terminations (not shown) on the chip 42 are electrically connected to the leads 44 of the TAB frame 40. Other means of applying leads to the chip 42 could be employed, if desired. Next, as represented in block 22 and shown in FIG. 5, the chip 42, with attached TAB frame 40, is attached to a cold header 46. Following this, the TAB leads 44 are cut and formed (block 24). The cold header 46 may be made of mullite, a metal with a thermal coefficient of expansion of 3.5 ppm, closely matching the thermal coefficient of expansion of silicon, which is 3 ppm. Reference may be had to FIG. 6, which shows the resulting structure with chip 42 having cut leads 44 attached to cold header 46, and to FIG. 7, which is a fragmentary elevation view of the chip 42, the cold header 46, and a lead 44, which has been inner lead bonded at junction 49 to a corresponding termination on the chip 42. In the final step of this sub-assembly, represented in block 26 and shown in FIG. 8, the cold header 46 and attached chip 42 with leads 44 are fixed to a thermally insulating header frame 50 having an aperture 52 in which the assembled chip 42 and header 46 are positioned.

Figure 9A:
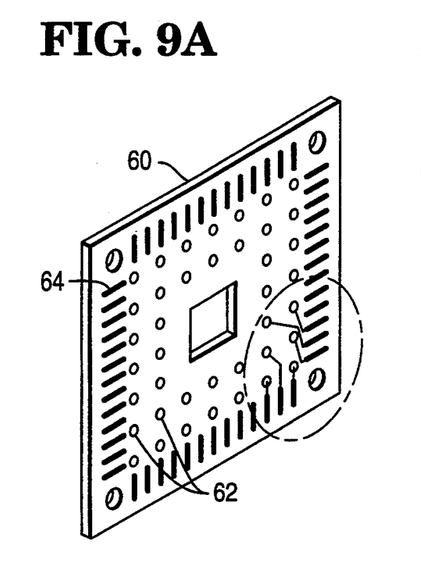
Figure 9B:
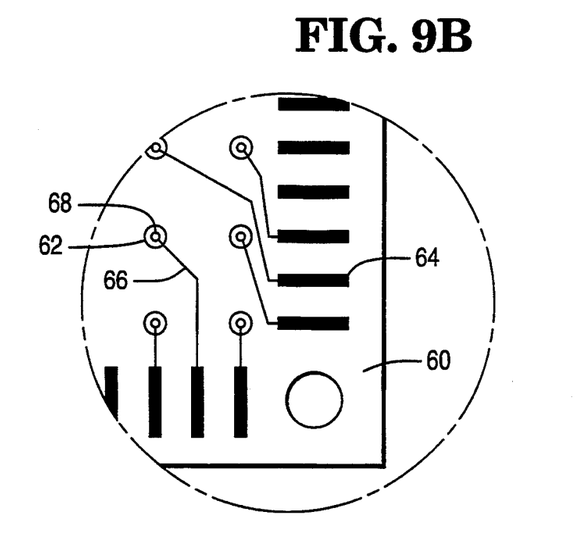
Figure 10:
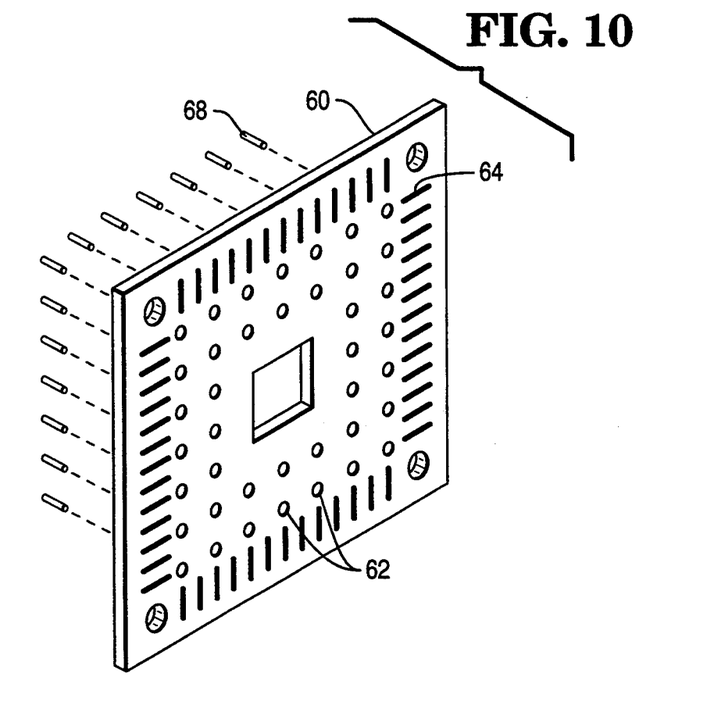
FIG. 10 is an exploded perspective view showing the assembly of a plurality of thin walled hollow pins to the holes in the pitch translator printed circuit board.

In the first step of the process for the second sub-assembly, represented by block 28 in FIG. 2 and shown in FIG. 9, a pitch translator, which may be embodied in a printed circuit board 60, is fabricated. The pitch translator translates the peripheral pitch of the TAB leads 44 of the chip 42 to an array pitch of small holes 62 in the printed circuit board 60. The TAB leads 44 will subsequently engage small pads 64 which are connected by conductors 66 to the holes 62. In the second step of this process, represented by block 30, a plurality of thin wall stainless steel hollow pins 68 or other attachment devices such as PGA (pin grid array) pins or solder balls are attached to the printed circuit board 60, one pin or other device for each hole 62, in an array pattern determined by the holes, as shown in FIG. 10. The pins or other devices are provided for connection to another circuit board.

Figure 11:
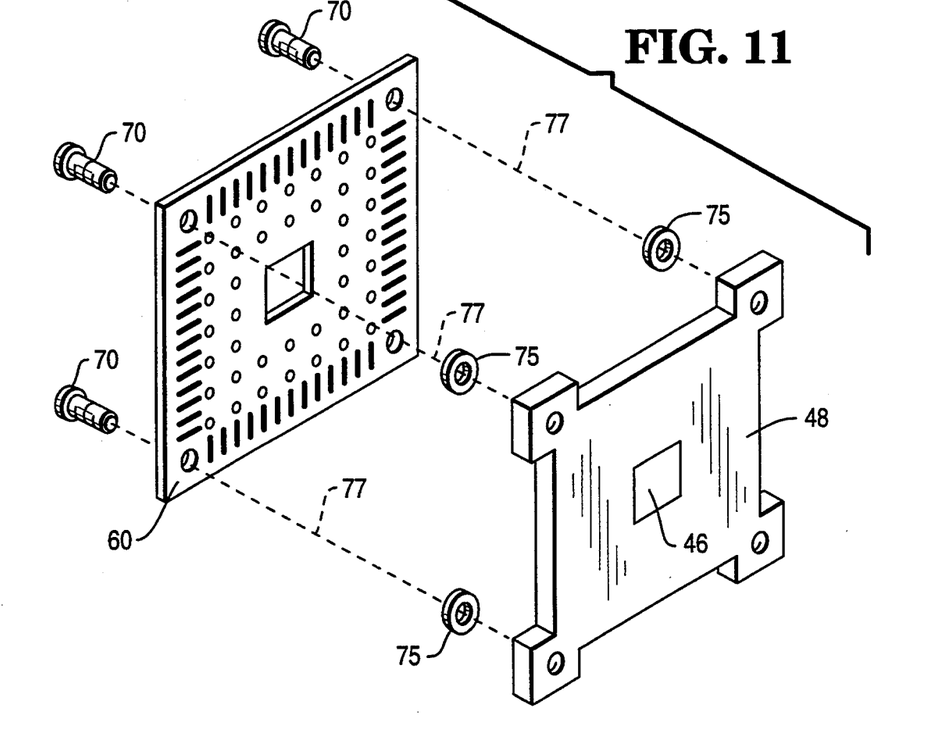
FIG. 11 is an exploded perspective view showing the assembly of the header frame with the assembled cold header and semiconductor chip to the pitch translator printed circuit board.
Figure 12:
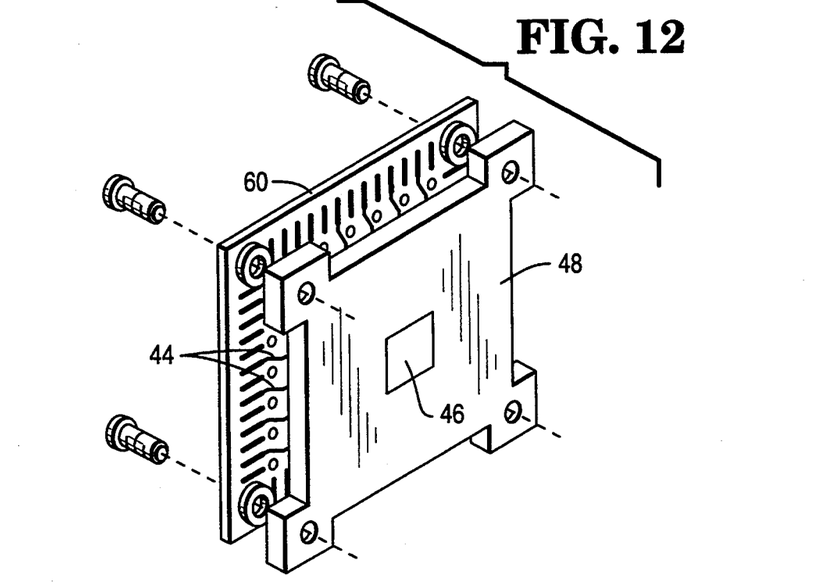
FIG. 12 is a view similar to FIG. 11, showing the header frame and the printed circuit board slightly separated, with the chip leads attached to conductive elements on the printed circuit board.
Figure 13:
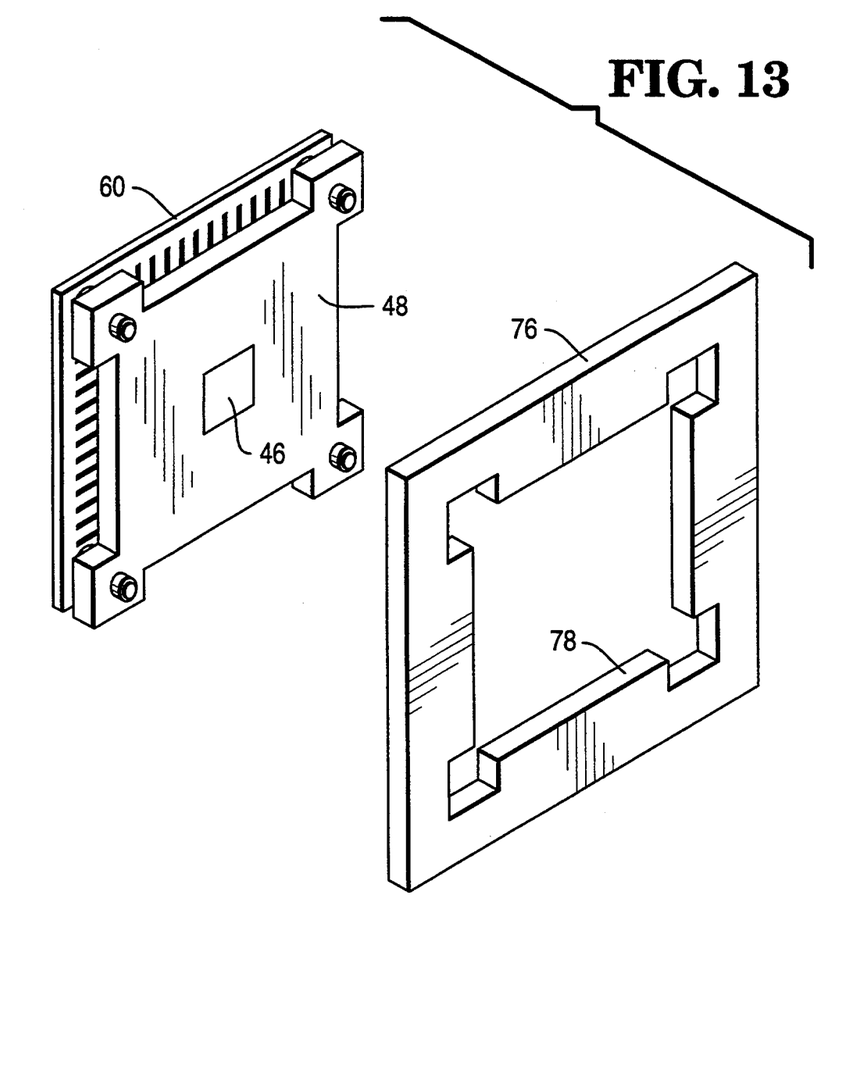
FIG. 13 is an exploded perspective view showing the assembly of a cavity insulator to the structure of FIG. 12.

In the first step of the process for assembling the two sub-assemblies, as represented by block 32 of FIG. 3, and as shown in FIG. 11, the pitch translator printed circuit board 60 with pins 68 fixed thereto is attached to the sub-assembly which includes the header frame 48, the chip 42 and the cold header 46. This assembly may be accomplished by the use of screws or other suitable fasteners 70 through apertures 72 in the printed circuit board 60 and apertures 74 in the header frame 48. A spacer 75 may be interposed between the circuit board 60 and the header frame 48 on the axis 77 of each fastener 70 in order to maintain a space between the board 60 and the header frame 48 for insulation purposes. During this assembly, as the board 60 and the frame 48 are brought into proximity with each other, the TAB leads 44 are connected to the pads 64 on the board 60, as shown in FIG. 12, and as represented in block 34 of FIG. 3. Finally, as represented in block 36 of FIG. 3, and as shown in FIG. 13, a cavity insulator 76 is connected by any suitable means, such as bonding or mechanical connectors, to the assembled header frame 48 and pitch translating printed circuit board 60. An aperture 78 having the shape of the header frame 48 may be provided in the cavity insulator 76 in order to facilitate such assembly.

The thermal chip package can be inserted into a controlled heater. The heater is controlled to supply heat to the stainless steel thin wall pins in order to keep the temperature above freezing to prevent frost formation. Depending upon the temperature of the chip on the cold header, the thermal conduction of a TAB lead, the total number of leads, the thermal conduction of the pitch translator printed circuit board to the thin wall stainless steel pins, and the thermal conduction of the thin wall stainless steel pins, a controlled heater may not be needed.

It should be noted that the silicon chip body is directly attached to the cold header, while being electrically and thermally attached to the pitch translator circuit board only by the TAB leads. Since the cross-section of the TAB leads is very small, typically two mils wide by one mil thick, the thermal conduction is small. The silicon chip body is thermally isolated from the pitch translator circuit board by air in a non-hermetic assembly or by a vacuum in a hermetic assembly. The thin wall stainless pins, typically 29 gauge, are poor heat conductors because, of all metals, stainless steel conducts heat the least, while the mechanical characteristics of stainless steel are such that the walls can be made very thin, providing a small thermal cross-section.

Although the invention has been described with particular reference to a preferred embodiment thereof, variations and modifications of the present invention can be effected within the spirit and scope of the following claims.

What is claimed is:

1. A method for assembling a semiconductor chip in a cooling package, to provide a cooling path from the chip to a cooling source while reducing the thermal conductivity electrical connections from the chip to a circuit board on which it is mounted, comprising the following steps:
   (a) applying leads to a chip;
   (b) attaching the chip to a header for cooling the chip;
   (c) attaching the chip and header to a header frame;
   (d) providing a pitch translator for translating the pitch of the chip leads to an array of holes in said pitch translator;
   (e) attaching circuit board attachment devices to the holes in the pitch translator;
   (f) attaching the leads of the chip to the pitch translator;
   (g) attaching the pitch translator to the header frame; and
   (h) attaching an insulator for insulating the header and the header frame to the assembled header frame and pitch translator.

2. The method of claim 1, also including the step of operatively coupling the assembled cooling package to a heater to supply heat to the attachment devices to prevent frost formation thereon.

3. The method of claim 1, in which the attachment devices are thin wall hollow pins.

4. The method of claim 1, in which the attachment devices are PGA pins.

5. The method of claim 1, in which the attachment devices are solder balls.

6. A method for assembling a semiconductor chip in a cooling package, to provide a cooling path from the chip to a cooling source while reducing the thermal conductivity of electrical connections from the chip to a circuit board on which it is mounted, comprising the following steps:
   (a) inner lead bonding a tape automated bonding (TAB) frame to the chip;
   (b) attaching the bonded chip to a header for cooling the chip;
   (c) cutting and forming the TAB leads to a desired peripheral pitch;
   (d) attaching the header and the bonded chip to a thermally insulating header frame;
   (e) providing a pitch translator printed circuit board which translates the peripheral pitch of the TAB leads to an array pitch of small holes capable of accepting attachment devices;
   (f) attaching attachment devices for electrically coupling the chip to a second circuit board to the pitch translator printed circuit board in the array pattern determined by the holes in said pitch translator printed circuit board;
   (g) bonding the leads of the chip to the pitch translator printed circuit board;
   (h) attaching the pitch translator printed circuit board to the header frame; and (i) attaching an insulator for insulating the header and the header frame to the assembled header frame and pitch translator printed circuit board.

7. The method of claim 6, also including the step of connecting the assembled cooling package to a controlled heater to supply heat to said attachment devices to keep the attachment device temperature above freezing to prevent frost formation.

8. The method of claim 6, in which the attachment devices are thin wall hollow stainless steel pins.

9. The method of claim 6, in which the attachment devices are PGA pins.

10. The method of claim 6, in which the attachment devices are solder balls.

11. A method for assembling a semiconductor chip in a cooling package, to provide a cooling path from the chip to a cooling source while reducing the thermal conductivity of electrical connections from the chip to a circuit board on which it is mounted, comprising the following steps:

(a) providing a first sub-assembly in which a chip having a plurality of leads is attached to a header for cooling the chip, and the combination is attached to a thermally insulating header frame;

(b) providing a second sub-assembly comprising a pitch translator in which the pitch of the chip leads is translated to an array pitch of small holes, and in which each of a plurality of attachment devices is positioned in one of said holes;

(c) electrically connecting each of the chip leads to the pitch translator;

(d) attaching the pitch translator to the header frame; and (e) attaching an insulator for insulating the header and the header frame to the assembled pitch translator and header frame.

12. The method of claim 11, also including the step of inserting the assembled pitch translator, header frame and insulator into a controlled heater.

13. The method of claim 11, in which the pitch translator comprises a printed circuit board.

14. The method of claim 11, in which the attachment devices are thin walled hollow stainless steel pins.

15. The method of claim 11, in which the attachment devices are PGA pins.

16. The method of claim 11, in which the attachment devices are solder balls.

* * * * *

UNITED STATES PATENT AND TRADEMARK OFFICE
CERTIFICATE OF CORRECTION

PATENT NO. : 5,427,984
DATED : June 27, 1995
INVENTOR(S) : Johan O. Hilbrink

It is certified that error appears in the above-indentified patent and that said Letters Patent is hereby corrected as shown below:

Column 4, line 14, after "conductivity" insert --of--.

Signed and Sealed this

Fourth Day of June, 1996

Attest:

BRUCE LEHMAN

Attesting Officer     Commissioner of Patents and Trademarks